United States Patent
Fujii et al.

(10) Patent No.: US 9,599,641 B2
(45) Date of Patent: Mar. 21, 2017

(54) CURRENT DETECTION DEVICE

(71) Applicants: Shigeo Fujii, Tokyo (JP); Daigo Matsumoto, Tokyo (JP)

(72) Inventors: Shigeo Fujii, Tokyo (JP); Daigo Matsumoto, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 235 days.

(21) Appl. No.: 14/421,040

(22) PCT Filed: Nov. 26, 2012

(86) PCT No.: PCT/JP2012/080501
§ 371 (c)(1),
(2) Date: Feb. 11, 2015

(87) PCT Pub. No.: WO2014/080526
PCT Pub. Date: May 30, 2014

(65) Prior Publication Data
US 2015/0204914 A1    Jul. 23, 2015

(51) Int. Cl.
*G01R 19/00* (2006.01)
*G01R 15/18* (2006.01)
*G01R 35/00* (2006.01)

(52) U.S. Cl.
CPC ....... *G01R 19/0092* (2013.01); *G01R 15/181* (2013.01); *G01R 35/005* (2013.01)

(58) Field of Classification Search
CPC . G01R 19/0092; G01R 15/181; G01R 35/005
(Continued)

(56) References Cited

U.S. PATENT DOCUMENTS 4,933,630 A * 6/1990 Dupraz ................ G01R 15/181
324/107

FOREIGN PATENT DOCUMENTS

JP    55-067658 A    5/1980
JP    62-152269 U    9/1987
(Continued)

OTHER PUBLICATIONS

Office Action issued on Jul. 27, 2016, by the Chinese Patent Office in corresponding Chinese Patent Application No. 201280076915.X and partial English translation of the Office Action. (8 pages).
(Continued)

*Primary Examiner* — Farhana Hoque
(74) *Attorney, Agent, or Firm* — Buchanan Ingersoll & Rooney PC

(57) ABSTRACT

The current detection device includes a plurality of air-cored coils respectively attached to conductors for a plurality of phases, which are supported by an insulator and housed in a ferromagnetic tank a plurality of output-voltage detection circuits that detect output voltages of the air-cored coils for respective phases; and a correction processing circuit that obtains, by dividing the output voltages of the air-cored coils for respective phases by transformation ratios of the air-cored coils, current value levels, which are temporary values of currents flowing in the conductors for respective phases, calculates the output-voltage correction values for respective phases according to the current value levels of respective phases, and calculates and outputs current flowing in the conductors for respective phases on the basis of the output-voltage correction values.

6 Claims, 4 Drawing Sheets

(58) Field of Classification Search
USPC .................................. 324/207.15, 107, 127
See application file for complete search history.

(56) References Cited

FOREIGN PATENT DOCUMENTS

| JP | 3-015762 A | 1/1991 |
|----|------------|--------|
| JP | 2002-162423 A | 6/2002 |
| JP | 2003-270272 A | 9/2003 |
| JP | 2003-279600 A | 10/2003 |
| WO | WO 2013/179479 A1 | 12/2013 |

OTHER PUBLICATIONS

International Search Report (PCT/ISA/210) mailed on Jan. 8, 2013, by the Japanese Patent Office as the International Searching Authority for International Application No. PCT/JP2012/080501.
Written Opinion (PCT/ISA/237) mailed on Jan. 8, 2013, by the Japanese Patent Office as the International Searching Authority for International Application No. PCT/JP2012/080501.
Taniguchi et al., "Advanced CT/PD", Mitsubishi Denki giho, vol. 75, No. 8, 2001, pp. 31-36.

* cited by examiner

CORRECTION PROCESSING CIRCUIT (a)

(b)

| CURRENT RATIO i (RATIO TO RATED VALUE) | n21 (i) | n31 (i) | n12 (i) | n32 (i) | n13 (i) | n23 (i) |
|---|---|---|---|---|---|---|
| 200 | n21 (200) | n31 (200) | n12 (200) | n32 (200) | n13 (200) | n23 (200) |
| 150 | n21 (150) | n31 (150) | n12 (150) | n32 (150) | n13 (150) | n23 (150) |
| 120 | n21 (120) | n31 (120) | n12 (120) | n32 (120) | n13 (120) | n23 (120) |
| 100 | n21 (100) | n31 (100) | n12 (100) | n32 (100) | n13 (100) | n23 (100) |
| 50 | n21 (50) | n31 (50) | n12 (50) | n32 (50) | n13 (50) | n23 (50) |
| 40 | n21 (40) | n31 (40) | n12 (40) | n32 (40) | n13 (40) | n23 (40) |
| 30 | n21 (30) | n31 (30) | n12 (30) | n32 (30) | n13 (30) | n23 (30) |
| 20 | n21 (20) | n31 (20) | n12 (20) | n32 (20) | n13 (20) | n23 (20) |
| 10 | n21 (10) | n31 (10) | n12 (10) | n32 (10) | n13 (10) | n23 (10) |
| 5 | n21 (5) | n31 (5) | n12 (5) | n32 (5) | n13 (5) | n23 (5) |
| 1 | n21 (1) | n31 (1) | n12 (1) | n32 (1) | n13 (1) | n23 (1) |

CURRENT DETECTION DEVICE

FIELD

The present invention relates to a current detection device that detects the current flowing in conductors for a plurality of phases on the basis of the output voltages of air-cored coils (which are also referred to as "Rogowski coils") that are attached to the phase conductors, respectively.

BACKGROUND

When the current flowing in a conductor for each of three phases, e.g., A-phase, B-phase, and C-phase, is measured, the voltage generated by the current flowing in the conductors for the other phases is superimposed on an air-cored coil and this affects the accuracy of the output from the current detection device. Therefore, for conventional current detection devices, for example, a technology has been disclosed in which a correction process is performed that takes the voltage superimposed due to other phase currents into consideration and the result of the correction process is output as the current flowing in each phase conductor (for example, Patent Literature 1).

CITATION LIST

Patent Literature

Patent Literature 1: Japanese Patent Application Laid-open No. 2003-279600

SUMMARY

Technical Problem

However, with the above conventional technology, the correction is performed by using values under a certain current condition as correction factors; therefore, in a case where the effect on the accuracy of the outputs of other phases changes in accordance with changes in magnitude of the current, accurate correction cannot be performed. Specifically, for example, when each phase conductor is housed in one tank and the tank is made of a ferromagnetic material, such as iron, the magnetic properties change depending on the magnetic field strength that is proportional to the current flowing in each phase conductor. In other words, there is a problem in that the magnetic flux density distribution in the tank changes depending on the magnitude of the current; therefore, the effect of other phases superimposed on the air-cored coil cannot be accurately corrected and thus the current cannot be detected with high accuracy.

The present invention has been achieved in view of the above and an object of the present invention is to provide a current detection device capable of detecting current with high accuracy irrespective of the magnitude of the current flowing in the conductors.

Solution to Problem

In order to solve the above problems and achieve the object, a current detection device including: a plurality of air-cored coils that are attached to conductors for a plurality of phases, respectively, the conductors being supported by an insulator and housed in a tank made of a ferromagnetic material; a plurality of output-voltage detection circuits that detect an output voltage of the air-cored coil for each phase; and a correction processing circuit that calculates an output-voltage correction value for each phase on a basis of an output voltage of the air-cored coil for each phase, and calculates and outputs current flowing in the conductor for each phase on a basis of the output-voltage correction value, wherein the correction processing circuit obtains, by dividing an output voltage of the air-cored coil for each phase by a transformation ratio of the air-cored coil, a current value level, which is a temporary value of current flowing in the conductor for the phase, and calculates the output-voltage correction value for each phase in accordance with the current value level of each phase.

Advantageous Effects of Invention

According to the present invention, an effect is obtained where it is possible to obtain a current detection device capable of detecting current with high accuracy irrespective of the magnitude of the current flowing in the conductors.

DESCRIPTION OF EMBODIMENTS

A current detection device according to embodiments of the present invention will be explained below in detail with reference to the accompanying drawings. The present invention is not limited to the embodiments to be described below.

Embodiment

Figure 1:
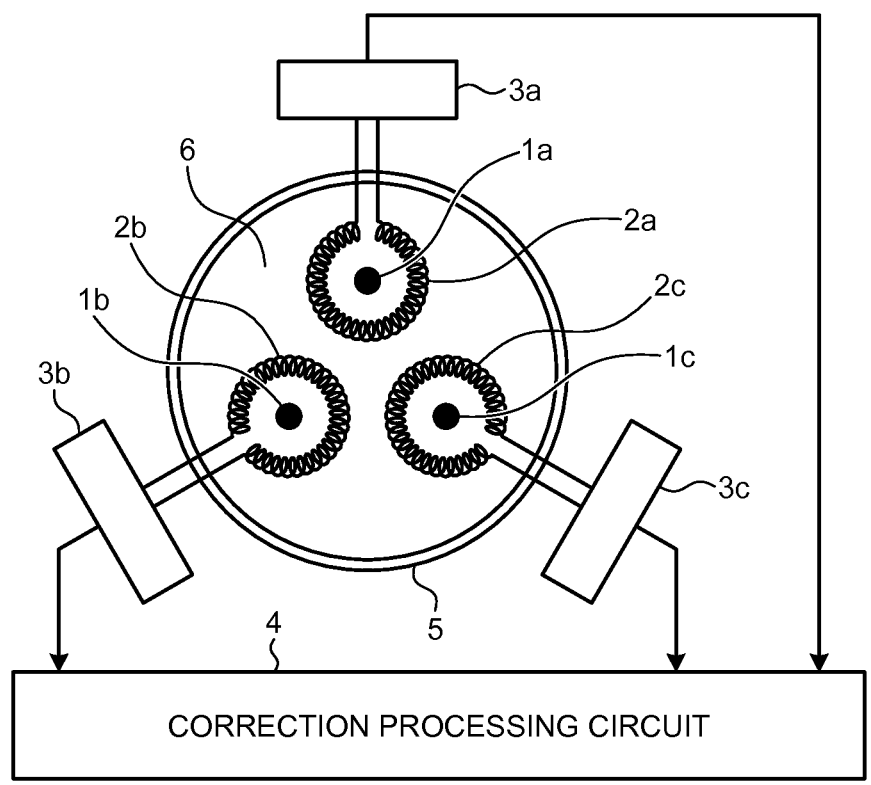
FIG. 1 is a diagram illustrating an example of the configuration of a current detection device according to an embodiment.

FIG. 1 is a diagram illustrating an example of the configuration of a current detection device according to an embodiment. In the example illustrated in FIG. 1, a tank cross-sectional view of a gas-insulated switchgear is illustrated. In the gas-insulated switchgear, an A-phase conductor 1a, a B-phase conductor 1b, and a C-phase conductor 1c (hereinafter, when it is not particularly necessary to distinguish between them, they are referred to as "phase conductors 1a, 1b, and 1c"), in which phase currents respectively flow from a three-phase power source (not illustrated) having three phases, i.e., A phase, B phase, and C phase, are arranged in an substantially equilateral triangular shape and these phase conductors 1a, 1b, and 1c are supported by an insulator 6 and are housed in a metal tank 5.

As illustrated in FIG. 1, the current detection device according to the embodiment includes an A-phase air-cored coil 2a attached around the A-phase conductor 1a, a B-phase air-cored coil 2b attached around the B-phase conductor 1b, and a C-phase air-cored coil 2c attached around the C-phase conductor 1c (hereinafter, when it is not particularly necessary to distinguish between them, they are referred to as "air-cored coils 2a, 2b, and 2c"); an A-phase output-voltage detection circuit 3a that detects the output voltage of the A-phase air-cored coil 2a, a B-phase output-voltage detection circuit 3b that detects the output voltage of the B-phase air-cored coil 2b, and a C-phase output-voltage detection circuit 3c that detects the output voltage of the C-phase air-cored coil 2c (hereinafter, when it is not particularly necessary to distinguish between them, they are referred to as "output-voltage detection circuits 3a, 3b, and 3c"); and a correction processing circuit 4 that performs a correction process for each of the output voltages of the air-cored coils 2a, 2b, and 2c corresponding to the phase conductors 1a, 1b, and 1c, respectively, on the basis of the output voltages detected by the output-voltage detection circuits 3a, 3b, and 3c and then calculates and outputs the current flowing in each of the phase conductors 1a, 1b, and 1c on the basis of the result of the correction process.

When an A-phase current Ia is caused to flow in the A-phase conductor 1a, a magnetic field in accordance with the magnitude of the A-phase current Ia is generated and a voltage in accordance with the fluctuations of the magnetic flux interlinking the A-phase air-cored coil 2a appears in the A-phase air-cored coil 2a. At this point, magnetic flux interlinks the air-cored coils 2b and 2c for the phases other than the air-cored coil 2a's own phase (A phase) because of the magnetic field generated by the A-phase current Ia, and a voltage in accordance with the fluctuations of the interlinked magnetic flux appears in each of the air-cored coils 2b and 2c.

In a similar manner, when a B-phase current Ib is caused to flow in the B-phase conductor 1b, a magnetic field in accordance with the magnitude of the B-phase current Ib is generated and a voltage in accordance with the fluctuations of the magnetic flux interlinking the B-phase air-cored coil 2b appears in the B-phase air-cored coil 2b. At this point, magnetic flux interlinks the air-cored coils 2a and 2c for the phases other than the air-cored coil 2b's own phase (B phase) because of the magnetic field generated by the B-phase current Ib, and a voltage in accordance with the fluctuations of the interlinked magnetic flux appears in each of the air-cored coils 2a and 2c.

In a similar manner, when a C-phase current Ic is caused to flow in the C-phase conductor 1c, a magnetic field in accordance with the magnitude of the C-phase current Ic is generated and a voltage in accordance with the fluctuations of the magnetic flux interlinking the C-phase air-cored coil 2c appears in the C-phase air-cored coil 2c. At this point, magnetic flux interlinks the air-cored coils 2a and 2b for the phases other than the air-cored coil 2c's own phase (C phase) because of the magnetic field generated by the C-phase current Ic, and a voltage in accordance with the fluctuations of the interlinked magnetic flux appears in each of the air-cored coils 2a and 2b.

When attention is focused on the fact that an output voltage Va of the A-phase air-cored coil 2a, an output voltage Vb of the B-phase air-cored coil 2b, and an output voltage Vc of the C-phase air-cored coil 2c, which are detected by the output-voltage detection circuits 3a, 3b, and 3c, respectively, are affected by the fluctuations of the magnetic flux, i.e., each phase current, the output voltages Va, Vb, and Vc are respectively represented by the following Equations (1) to (3).

$$Va = k11*Ia + k12*Ib + k13*Ic \quad (1)$$

$$Vb = k21*Ia + k22*Ib + k23*Ic \quad (2)$$

$$Vc = k31*Ia + k32*Ib + k33*Ic \quad (3)$$

In the above Equation (1), the factor k11 is a factor for the voltage generated in the A-phase air-cored coil 2a due to the A-phase current Ia and is the transformation ratio of the A-phase air-cored coil 2a. The factor k12 is a factor for the voltage generated in the A-phase air-cored coil 2a due to the effect of the B-phase current Ib. The factor k13 is a factor for the voltage generated in the A-phase air-cored coil 2a due to the effect of the C-phase current Ic.

In the above Equation (2), the factor k22 is a factor for the voltage generated in the B-phase air-cored coil 2b due to the B-phase current Ib and is the transformation ratio of the B-phase air-cored coil 2b. The factor k21 is a factor for the voltage generated in the B-phase air-cored coil 2b due to the effect of the A-phase current Ia. The factor k23 is a factor for the voltage generated in the B-phase air-cored coil 2b due to the effect of the C-phase current Ic.

In the above Equation (3), the factor k33 is a factor for the voltage generated in the C-phase air-cored coil 2c due to the C-phase current Ic and is the transformation ratio of the C-phase air-cored coil 2c. The factor k31 is a factor for the voltage generated in the C-phase air-cored coil 2c due to the effect of the A-phase current Ia. The factor k32 is a factor for the voltage generated in the C-phase air-cored coil 2c due to the effect of the B-phase current Ib.

The transformation ratio k11 of the A-phase air-cored coil 2a can be obtained from the above Equation (1) by causing only the A-phase current Ia to flow. The transformation ratio k22 of the B-phase air-cored coil 2b can be obtained from the above Equation (2) by causing only the B-phase current Ib to flow. The transformation ratio k33 of the C-phase air-cored coil 2c can be obtained from the above Equation (3) by causing only the C-phase current Ic to flow. When the voltage that is generated in the A-phase air-cored coil 2a in the case where only the A-phase current Ia is caused to flow is va, the voltage that is generated in the B-phase air-cored coil 2b in the case where only the B-phase current Ib is caused to flow is vb, and the voltage that is generated in the C-phase air-cored coil 2c in the case where only the C-phase current Ic is caused to flow is vc, the transformation ratio k11 of the A-phase air-cored coil 2a, the transformation ratio k22 of the B-phase air-cored coil 2b, and the transformation ratio k33 of the C-phase air-cored coil 2c are represented by the following Equations (4) to (6).

$$k11 = va/Ia \quad (4)$$

$$k22 = vb/Ib \quad (5)$$

$$k33 = vc/Ic \quad (6)$$

In contrast, when attention is focused on the fact that a voltage proportional to the fluctuations of the magnetic flux is generated in the air-cored coils 2a, 2b, and 2c, the output voltages Va, Vb, and Vc are respectively represented by the following Equations (7) to (9).

$$Va = n11*va + n12*vb + n13*vc \quad (7)$$

$$Vb = n21*va + n22*vb + n23*vc \quad (8)$$

$$Vc = n31*va + n32*vb + n33*vc \quad (9)$$

The factors n11, n12, n13, n21, n22, n23, n31, n32, and n33 in the above Equations (7) to (9) can be calculated using the above Equations (7) to (9) by causing a single-phase current to flow.

In the above Equations (7) to (9), when only the A-phase current Ia is caused to flow, the following Equations (10) to (12) are obtained.

$$Va = n11*va \quad (10)$$

$$Vb = n21*va \quad (11)$$

$$Vc = n31*va \quad (12)$$

The factors n11, n21, and n31 can be respectively calculated by the following Equations (13) to (15), which are obtained by modifying the above Equations (10) to (12).

$$n11 = Va/va = 1 \quad (13)$$

$$n21 = Vb/va \quad (14)$$

$$n31 = Vc/va \quad (15)$$

When only the A-phase current Ia is caused to flow, the output voltage Va is equal to va and the factor n11=1, as indicated by Equation (13).

The factor n21 is a factor that indicates the degree of effect had on the output voltage Vb by causing the A-phase current Ia to flow. That is, the factor n21 is a voltage correction factor for the A-phase voltage when the B-phase voltage is a correction processing target. The factor n31 is a factor that indicates the degree of effect had on the output voltage Vc by causing the A-phase current Ia to flow. That is, the factor n31 is a voltage correction factor for the A-phase voltage when the C-phase voltage is a correction processing target.

In the above Equations (7) to (9), when only the B-phase current Ib is caused to flow, the following Equations (16) to (18) are obtained.

$$Va = n12*vb \quad (16)$$

$$Vb = n22*vb \quad (17)$$

$$Vc = n32*vb \quad (18)$$

The factors n12, n22, and n32 can be respectively calculated by the following Equations (19) to (21), which are obtained by modifying the above Equations (16) to (18).

$$n12 = Va/vb \quad (19)$$

$$n22 = Vb/vb = 1 \quad (20)$$

$$n32 = Vc/vb \quad (21)$$

When only the B-phase current Ib is caused to flow, the output voltage Vb is equal to vb and the factor n22=1, as indicated by Equation (20).

The factor n12 is a factor that indicates the degree of effect had on the output voltage Va by causing the B-phase current Ib to flow. That is, the factor n12 is a voltage correction factor for the B-phase voltage when the A-phase voltage is a correction processing target. The factor n32 is a factor that indicates the degree of effect had on the output voltage Vc by causing the B-phase current Ib to flow. That is, the factor n32 is a voltage correction factor for the B-phase voltage when the C-phase voltage is a correction processing target.

In the above Equations (7) to (9), when only the C-phase current Ic is caused to flow, the following Equations (22) to (24) are obtained.

$$Va = n13*vc \quad (22)$$

$$Vb = n23*vc \quad (23)$$

$$Vc = n33*vc \quad (24)$$

The factors n13, n23, and n33 can be respectively calculated by the following Equations (25) to (27), which are obtained by modifying the above Equations (22) to (24).

$$n13 = Va/vc \quad (25)$$

$$n23 = Vb/vc \quad (26)$$

$$n33 = Vc/vc = 1 \quad (27)$$

When only the C-phase current Ic is caused to flow, the output voltage Vc is equal to vc and the factor n33=1, as indicated by Equation (27).

The factor n13 is a factor that indicates the degree of effect had on the output voltage Va by causing the C-phase current Ic to flow. That is, the factor n13 is a voltage correction factor for the C-phase voltage when the A-phase voltage is a correction processing target. The factor n23 is a factor that indicates the degree of effect had on the output voltage Vb by causing the C-phase current Ic to flow. That is, the factor n23 is a voltage correction factor for the C-phase voltage when the B-phase voltage is a correction processing target.

The phase voltages for calculating the phase currents during a normal operation, i.e., when the phase currents Ia, Ib, and Ic flow in the phase conductors 1a, 1b, and 1c, respectively, i.e., an A-phase output-voltage correction value VVa, a B-phase output-voltage correction value VVb, and a C-phase output-voltage correction value VVc are represented by the following Equations (28) to (30), which are obtained by modifying the above Equations (7) to (9).

$$VVa = Va - n12*VVb - n13*VVc \quad (28)$$

$$VVb = Vb - n21*VVa - n23*VVc \quad (29)$$

$$VVc = Vc - n31*VVa - n32*VVb \quad (30)$$

The above Equation (28) indicates that, when the A-phase voltage is a correction processing target, the A-phase output-voltage correction value VVa can be obtained by subtracting, from the output voltage Va of the A-phase air-cored coil 2a, the value that is obtained by multiplying the B-phase output-voltage correction value VVb by the B-phase voltage correction factor n12 when the A-phase voltage is a correction processing target and the value that is obtained by multiplying the C-phase output-voltage correction value VVc by the C-phase voltage correction factor n13 when the A-phase voltage is a correction processing target.

The above Equation (29) indicates that, when the B-phase voltage is a correction processing target, the B-phase output-voltage correction value VVb that is a correction processing target phase can be obtained by subtracting, from the output voltage Vb of the B-phase air-cored coil 2b, the value that is obtained by multiplying the A-phase output-voltage correction value VVa by the A-phase voltage correction factor n21 when the B-phase voltage is a correction processing target and the value that is obtained by multiplying the C-phase output-voltage correction value VVc by the C-phase voltage correction factor n23 when the B-phase voltage is a correction processing target.

The above Equation (30) indicates that, when the C-phase voltage is a correction processing target, the C-phase output-voltage correction value VVc can be obtained by subtracting, from the output voltage Vc of the C-phase air-cored coil 2c, the value that is obtained by multiplying the A-phase output-voltage correction value VVa by the A-phase voltage correction factor n31 when the C-phase voltage is a correction processing target and the value that is obtained by multiplying the B-phase output-voltage correction value VVb by the B-phase voltage correction factor n32 when the C-phase voltage is a correction processing target.

In other words, the A-phase output-voltage correction value VVa, the B-phase output-voltage correction value VVb, and the C-phase output-voltage correction value VVc can be obtained by solving the simultaneous equations consisting of the above Equations (28) to (30).

The phase currents Ia, Ib, and Ic are respectively represented by the following Equations (31) to (33) using the transformation ratios k11, k22, and k33 of the air-cored coils 2a, 2b, and 2c represented by the above Equations (4) to (7).

$$Ia = VVa/k11 \quad (31)$$

$$Ib = VVb/k22 \quad (32)$$

$$Ic = VVc/k33 \quad (33)$$

Therefore, before a normal operation is started, a single-phase energization test is performed so as to obtain in advance the transformation ratios k11, k22, and k33 of the air-cored coils 2a, 2b, and 2c and the voltage correction factors n21, n31, n12, n32, n13, and n23. The output voltages Va, Vb, and Vc of the air-cored coils 2a, 2b, and 2c are then respectively substituted into the above Equations (28) to (30) when a normal operation is performed, whereby the phase output-voltage correction values VVa, VVb, and VVc can be obtained. The phase currents Ia, Ib, and Ic can be obtained by substituting these phase output-voltage correction values VVa, VVb, and VVc into the above Equations (31) to (33), respectively.

In the present embodiment, the values of the voltage correction factors n21, n31, n12, n32, n13, and n23 to be used in the above Equations (28) to (30) are changed in accordance with the magnitude of the phase currents Ia, Ib, and Ic. The technical intent for this will be explained below.

In the conventional technology, the output voltages Va, Vb, and Vc of the air-cored coils 2a, 2b, and 2c are corrected while the values of the voltage correction factors n21, n31, n12, n32, n13, and n23 are made constant, and the current is detected. In such a case, the premise is that the distribution of the magnetic flux generated near each of the air-cored coils 2a, 2b, and 2c is constant irrespective of the magnitude of the phase currents Ia, Ib, and Ic. However, when a ferromagnetic material, such as iron, is arranged near each phase conductor, the magnetic flux distribution changes non-linearly in accordance with the current flowing in each phase conductor.

Figure 2:
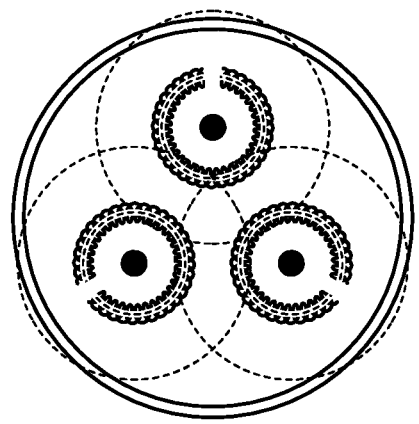
FIG. 2 is a diagram illustrating the magnetic flux distribution when a tank is made of aluminum.
Figure 3:
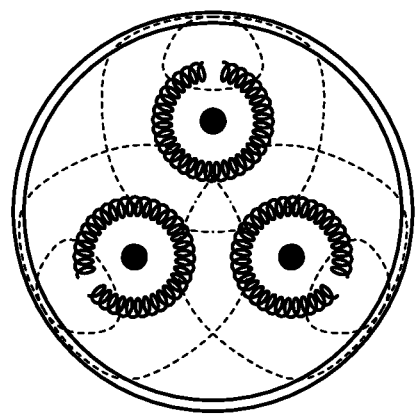
FIG. 3 is a diagram illustrating the magnetic flux distribution when a tank is made of iron.
Figure 3:
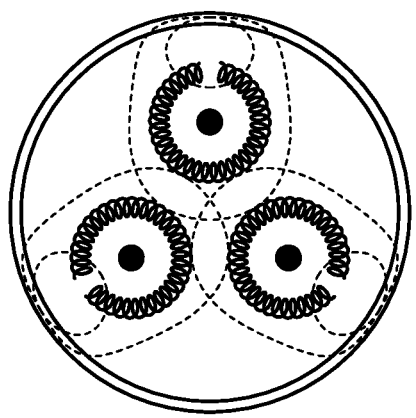
Figure 4:
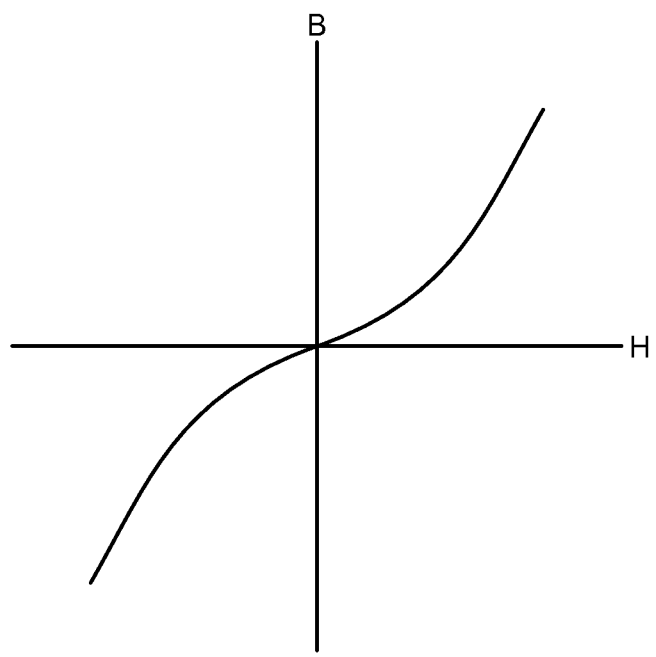
FIG. 4 is a diagram illustrating an example of the B-H characteristics of ferromagnetic materials.

FIG. 2 is a diagram illustrating the magnetic flux distribution when the tank is made of aluminum. FIG. 3 is a diagram illustrating the magnetic flux distribution when the tank is made of iron. In FIG. 2 and FIG. 3, the broken lines indicate the magnetic flux generated by causing the phase currents Ia, Ib, and Ic to flow in the phase conductors 1a, 1b, and 1c, respectively. FIG. 3(a) and FIG. 3(b) illustrate examples where the phase currents Ia, Ib, and Ic are different. FIG. 4 is a diagram illustrating an example of the B-H characteristics of ferromagnetic materials, where B represents the magnetic flux density and H represents the magnetic field strength.

For example, as illustrated in FIG. 2, when the tank 5 is made of aluminum, because the magnetic permeability is close to one, the magnetic flux is uniformly distributed radially from each of the phase conductors 1a, 1b, and 1c. In such a case, the magnetic flux distribution becomes constant irrespective of the magnitude of the phase currents Ia, Ib, and Ic.

In contrast, as illustrated in FIG. 3, when the tank 5 is made of a ferromagnetic material, such as iron, the magnetic flux distribution is concentrated on the side of the tank 5 made of a ferromagnetic material. If the magnetic flux distribution is constant irrespective of the magnitude of the phase currents Ia, Ib, and Ic flowing in the phase conductors 1a, 1b, and 1c, as described above, even if the value of each of the voltage correction factors n21, n31, n12, n32, n13, and n23 is made constant, it is still possible to accurately correct the effect of other phases superimposed on an air-cored coil. However, as illustrated in FIG. 4, the B-H characteristics of ferromagnetic materials are not linear but non-linear and the magnetic flux distribution in the tank 5 changes in accordance with the magnetic field strength H, i.e., the magnitude of the phase currents Ia, Ib, and Ic (FIGS. 3(a) and (b)); therefore, the amount of magnetic flux interlinking each of the air-cored coils 2a, 2b, and 2c also changes. In other words, each of the output voltages Va, Vb, and Vc of the air-cored coils 2a, 2b, and 2c does not change at a constant rate in accordance with the magnitude of the phase currents Ia, Ib, and Ic but changes non-linearly.

Therefore, in the present embodiment, the values of the voltage correction factors n21, n31, n12, n32, n13, and n23 to be used in the above Equations (28) to (30) when the phase output-voltage correction values VVa, VVb, and VVc are calculated are set to values in accordance with the magnitude of the phase currents Ia, Ib, and Ic.

For example, before a normal operation is started, when the voltage correction factors n21, n31, n12, n32, n13, and n23 are calculated in advance, the phase currents Ia, Ib, and Ic to be applied to the phase conductors 1a, 1b, and 1c are changed and a plurality of values in accordance with the magnitude of the phase currents Ia, Ib, and Ic are stored. Then, during a normal operation, a current value level Ia0 of the A-phase current Ia is obtained by assigning the output voltage Va of the A-phase air-cored coil 2a to VVa in the above Equation (31). In a similar manner, a current value level Ib0 of the B-phase current Ib is obtained by assigning the output voltage Vb of the B-phase air-cored coil 2b to VVb in the above Equation (32). In a similar manner, a current value level Ic0 of the C-phase current Ic is obtained by assigning the output voltage Vc of the C-phase air-cored coil 2c to VVc in the above Equation (33). The voltage correction factors n21, n31, n12, n32, n13, and n23 in accordance with the current value levels Ia0, Ib0, and Ic0 of the phase currents Ia, Ib, and Ic are used in the above Equations (28) to (30) to obtain the phase output-voltage correction values VVa, VVb, and VVc. The phase output-voltage correction values VVa, VVb, and VVc obtained in such a manner are substituted into the above Equations (31) to (33) to obtain the phase currents Ia, Ib, and Ic, thus enabling the current to be detected with high accuracy.

The current value levels Ia0, Ib0, and Ic0 obtained in the above manner are temporary values of the phase currents Ia, Ib, and Ic and are obtained by using the output voltages Va, Vb, and Vc of the air-cored coils 2a, 2b, and 2c, respectively; therefore, the current value levels Ia0, Ib0, and Ic0 contain an error due to the induced voltage to be superimposed because of the other phase currents. However, the error in each of the voltage correction factors n21, n31, n12, n32, n13, and n23 due to the error caused by the induced voltage can be considered to be extremely small. Therefore, even when the voltage correction factors n21, n31, n12, n32, n13, and n23 are derived by using the current value levels Ia0, Ib0, and Ic0 that contain the error due to the induced voltage to be superimposed because of the other phase currents, it is still possible to detect the current with high accuracy compared with the conventional technology in which the current is detected while the voltage correction factors n21, n31, n12, n32, n13, and n23 are set as constants.

Next, the operation of the current detection device according to the embodiment will be explained with reference to FIG. 5 and FIG. 6.

Figures 5, 6:
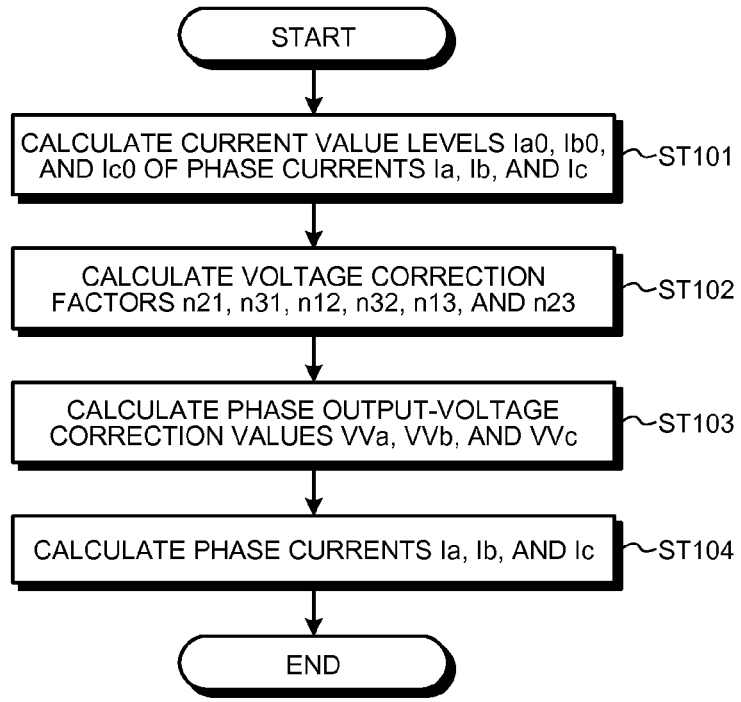
FIG. 5 is a diagram illustrating an example of a voltage correction factor table in the current detection device according to the embodiment.
FIG. 6 is a flowchart illustrating an example of a current detection process in the current detection device according to the embodiment.

FIG. 5 is a diagram illustrating an example of a voltage correction factor table in the current detection device according to the embodiment. As described above, before a normal operation is started, a single-phase energization test is performed so as to obtain, in advance, the transformation ratios k11, k22, and k33 of the air-cored coils 2a, 2b, and 2c and the voltage correction factors n21, n31, n12, n32, n13, and n23 and store them in the correction processing circuit 4. In the present embodiment, the voltage correction factors n21, n31, n12, n32, n13, and n23 for each current ratio i of each of the phase currents Ia, Ib, and Ic to the rated value are calculated by using the above Equations (14), (15), (19), (20), (25), and (26) and are stored in advance as a voltage correction factor table illustrated in FIG. 5.

FIG. 6 is a flowchart illustrating an example of a current detection process in the current detection device according to the embodiment.

During a normal operation, by using the output voltages Va, Vb, and Vc detected by the output-voltage detection circuits 3a, 3b, and 3c, the correction processing circuit 4 assigns the output voltage Va of the A-phase air-cored coil 2a to VVa in the above Equation (31) to obtain the current value level Ia0, which is a temporary value of the A-phase current Ia, assigns the output voltage Vb of the B-phase air-cored coil 2b to VVb in the above Equation (32) to obtain the current value level Ib0, which is a temporary value of the B-phase current Ib, and assigns the output voltage Vc of the C-phase air-cored coil 2c to VVc in the above Equation (33) to obtain the current value level Ic0, which is a temporary value of the C-phase current Ic (Step ST101).

Next, the correction processing circuit 4 converts the current value levels Ia0, Ib0, and Ic0 into the current ratio i of the phase currents Ia, Ib, and Ic to the rated value and refers to and interpolates the voltage correction factor table illustrated in FIG. 5 so as to derive the voltage correction factors n21, n31, n12, n32, n13, and n23 corresponding to the current ratio i (Step ST102). Linear interpolation can be used as an example of a method for interpolating the voltage correction factor table, and the present invention is not limited to the method for interpolating the voltage correction factor table.

Next, the correction processing circuit 4 applies the output voltages Va, Vb, and Vc and the voltage correction factors n21, n31, n12, n32, n13, and n23 to the above Equations (28) to (30) so as to derive the phase output-voltage correction values VVa, VVb, and VVc (Step ST103).

Then, the correction processing circuit 4 substitutes the phase output-voltage correction values VVa, VVb, and VVc into the above Equations (31) to (33) so as to calculate the phase currents Ia, Ib, and Ic (Step ST104) and ends the current detection process.

As described above, according to the current detection device in the embodiment, before a normal operation is performed, a single-phase current is caused to flow in each phase conductor in advance, the output voltage of an air-cored coil for a phase other than the energized phase is divided by the output voltage of the air-cored coil for the energized phase so as to obtain the voltage correction factor for the output voltage correction value for the energized phase when the output voltage of the air-cored coil for the other phase is a correction processing target, and a plurality of voltage correction factors in accordance with the magnitude of the energizing current are stored as the voltage correction factor table and moreover, the transformation ratio of each air-cored coil is obtained by dividing the output voltage of the air-cored coil for the energized phase by the energizing current and is stored. When a normal operation is performed, the current value level, which is a temporary value of current flowing in a conductor, is obtained by dividing the output voltage of an air-cored coil by the transformation ratio of the air-cored coil for each phase, each voltage correction factor corresponding to the current value level is derived by referring to and interpolating the voltage correction factor table, and each phase output-voltage correction value is calculated by using simultaneous equations consisting of a plurality of equations with each of which the output-voltage correction value for a phase that is a correction processing target is obtained by, when the output voltage of an air-cored coil for a given phase is a correction processing target, subtracting, from the output voltage of the air-cored coil for the given phase, a value that is obtained by multiplying the output-voltage correction value for another phase by the voltage correction factor in accordance with the current value level of the other phase. Then, phase currents flowing in the phase conductors are calculated by using the phase output-voltage correction values. Therefore, even under the environment where each phase conductor is housed in a tank made of a ferromagnetic material, the magnetic properties change depending on the magnetic field strength that is proportional to the current flowing in each phase conductor, and the magnetic flux density distribution in the tank changes non-linearly, the current can be detected with high accuracy irrespective of the magnitude of the current flowing in each conductor.

In the above embodiment, an explanation has been given of an example where conductors for three phases, in which phase currents from a three-phase power source flow, are housed in a tank made of a ferromagnetic material and the phase currents interact with each other; however, the number of conductors is not limited thereto. It is obvious that, under the condition where a ferromagnetic object having non-linear B-H characteristics is present near the conductors and the effect on the accuracy of the currents of other phases changes in accordance with changes in magnitude of the current flowing in a conductor due to the ferromagnetic object, even if the number of conductors interacting with each other is two or equal to or more than four, a similar effect can be obtained.

Moreover, in the above embodiment, an explanation has been given of a case where, before a normal operation is performed, a single-phase energization test is performed so as to obtain the transformation ratio of each air-cored coil in advance. However, it is obvious that, when the transformation ratio of each air-cored coil is known, the known transformation ratio of each air-cored coil can be used.

The configurations illustrated in the above embodiment are examples of the configuration of the present invention and it is obvious that the configurations can be combined with other publicly known technologies and the configurations can be changed, for example, by omitting a part thereof without departing from the scope of the present invention.

REFERENCE SIGNS LIST 1a (A-phase) conductor, 1b (B-phase) conductor, 1c (C-phase) conductor, 2a (A-phase) air-cored coil, 2b (B-phase) air-cored coil, 2c (C-phase) air-cored coil, 3a (A-phase) output-voltage detection circuit, 3b (B-phase) output-voltage detection circuit, 3c (C-phase) output-voltage detection circuit, 4 correction processing circuit, tank, 6 insulator.

The invention claimed is:

1. A current detection device comprising:
a plurality of air-cored coils that are attached to conductors for a plurality of phases, respectively, the conductors being supported by an insulator and housed in a tank made of a ferromagnetic material;
a plurality of output-voltage detection circuits that detect an output voltage of the air-cored coil for each phase; and
a correction processing circuit that calculates an output-voltage correction value for each phase on a basis of an output voltage of the air-cored coil for each phase, and calculates and outputs current flowing in the conductor for each phase on a basis of the output-voltage correction value, wherein
the correction processing circuit obtains, by dividing an output voltage of the air-cored coil for each phase by a transformation ratio of the air-cored coil, a current value level, which is a temporary value of current flowing in the conductor for the phase, and calculates the output-voltage correction value for each phase in accordance with the current value level of each phase.

2. The current detection device according to claim 1, wherein the correction processing circuit stores, for the output-voltage correction value for another phase when an output voltage of the air-cored coil for a given phase among a plurality of phases is a correction processing target, a voltage correction factor in accordance with a magnitude of current flowing in the conductor for the another phase, and calculates the output-voltage correction value for each phase by using a simultaneous equation including a plurality of equations with each of which the output-voltage correction value for the given phase is obtained by, when the output voltage of the air-cored coil for the given phase is a correction processing target, subtracting, from the output voltage of the air-cored coil for the given phase, a value that is obtained by multiplying the output-voltage correction value for the another phase by the voltage correction factor in accordance with the current value level of the another phase.

3. The current detection device according to claim 2, wherein the correction processing circuit stores a plurality of the voltage correction factors in accordance with a magnitude of current flowing in the conductors in a table format and derives the voltage correction factor by referring to and interpolating the table in accordance with the current value level.

4. The current detection device according to claim 2, wherein, before a normal operation is started, the correction processing circuit stores, as the voltage correction factor for the output-voltage correction value for an energized phase when an output voltage of the air-cored coil for another phase is a correction processing target, a value that is obtained by dividing the output voltage of the air-cored coil for the another phase, which is different from the energized phase, by an output voltage of the air-cored coil for the energized phase when current is individually caused to flow in the conductor for each phase.

5. The current detection device according to claim 1, wherein, before a normal operation is started, the correction processing circuit stores, as the transformation ratio of the air-cored coil for an energized phase, a value that is obtained by dividing an output voltage of the air-cored coil for the energized phase by energizing current when current is individually caused to flow in the conductor for each phase.

6. The current detection device according to claim 1, wherein the conductors for a plurality of phases are conductors for three phases in which phase currents respectively flows from a three-phase power source.

* * * * *